(12) United States Patent
Hietala et al.

(10) Patent No.: US 6,327,319 B1
(45) Date of Patent: Dec. 4, 2001

(54) PHASE DETECTOR WITH FREQUENCY STEERING

(75) Inventors: Alexander W. Hietala, Phoenix, AZ (US); David M. Gonzalez, Elgin, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/187,621

(22) Filed: Nov. 6, 1998

(51) Int. Cl.[7] .................................. H03D 3/24; H03L 7/06
(52) U.S. Cl. ......................... 375/374; 327/156; 327/257
(58) Field of Search ................................ 375/374, 373, 375/375, 215; 327/156, 157, 155, 147, 148; 329/307, 325; 331/25

(56) References Cited

U.S. PATENT DOCUMENTS

| 5,151,665 | 9/1992 | Wentzler ................................. 331/8 |
| 5,208,546 | 5/1993 | Nagaraj et al. ...................... 327/157 |
| 5,436,596 | 7/1995 | Folmer ................................ 331/1 A |
| 5,495,206 | * 2/1996 | Hietala ............................... 331/1 A |
| 5,703,539 | 12/1997 | Gillig et al. ........................... 331/16 |
| 6,002,273 | * 12/1999 | Humphreys .............................. 327/3 |

FOREIGN PATENT DOCUMENTS

| 0866559A1 | 9/1998 | (EP) . |
| 2335557A | 9/1999 | (GB) . |

OTHER PUBLICATIONS

Patent Abstract of Japan, JP1–128621, May 22, 1989, Fujitsu Ltd., "Charge Pump Circuit", 5 pages.
"RF And Miicrowave Digital Frequency Synthesizers: Theory And Design" by Ulrich L. Rohde, 1997, pp. 305, 309, 310, 311, 312.

Digital PLL Frequency Synthesizers by Ulrich L. Rohde, 1983, pp. 220–223.

* cited by examiner

Primary Examiner—Chi Pham
Assistant Examiner—Khai Tran
(74) Attorney, Agent, or Firm—Kevin D. Kaschke; Hisashi D. Watanabe

(57) ABSTRACT

A PLL (225) includes a phase detector (202) and a charge pump (210 or 212). The phase detector (202) includes a first D-type flip flop (302), a second D-type flip flop (304) and an AND gate forming a reset circuit (306). The charge pump (210 or 212) includes an up current source (308) and a down current source (310). The up current source (308) provides a constant current. The down current source (310) varies responsive to an output signal (207) generated by the second D-type flip flop (304). The constant current provided by the up current source (308) is made to be less than one half the current provided by the down current source (310) to bias the charge pump (210 or 212) in a negative direction to minimize false locks between the phase of a divided reference frequency signal (206) and the phase of a divided voltage controlled oscillator frequency signal (209). Alternatively, the up current source (308) may be controlled in an analogous manner with the down current source (310) being held constant to achieve a similar effect and advantage.

7 Claims, 8 Drawing Sheets

600

— PRIOR ART —

700

— PRIOR ART —

800

— PRIOR ART —

(WITH FREQUENCY STEERING)
2100

— PRIOR ART —

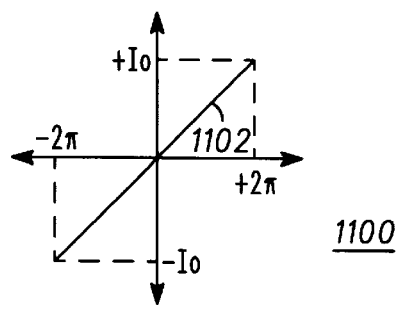
— PRIOR ART —
FIG.11
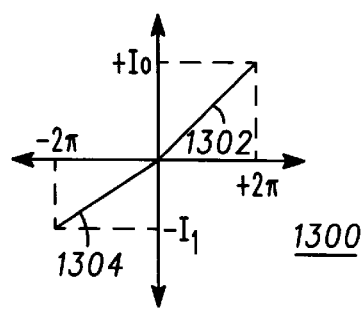
— PRIOR ART —
FIG.13
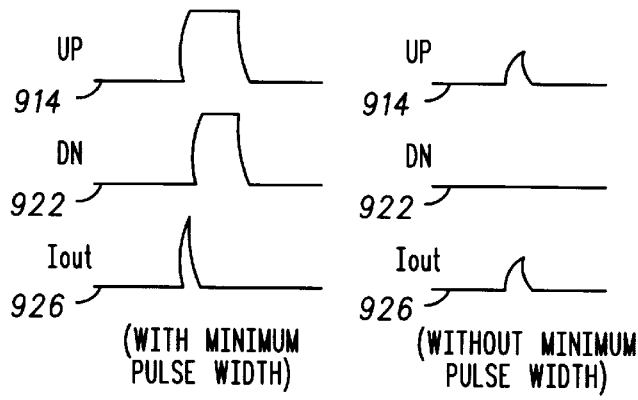
*1200*
— PRIOR ART —
FIG.12
FIG.14
— PRIOR ART —
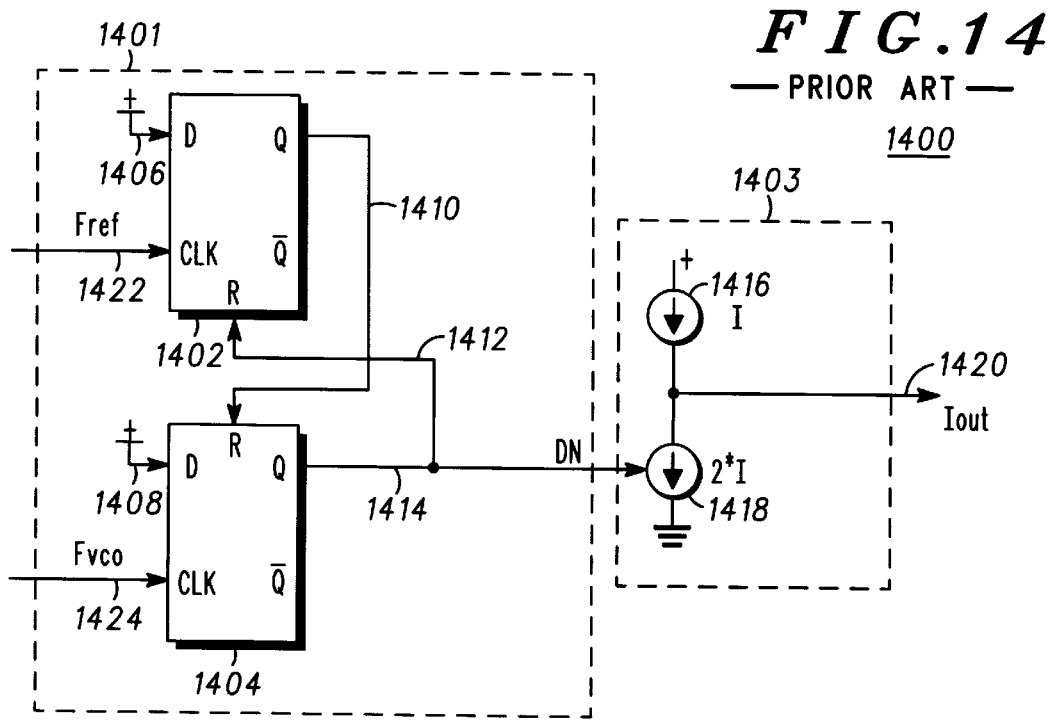

PHASE DETECTOR WITH FREQUENCY STEERING

FIELD OF THE INVENTION

The present invention generally relates to phase detectors for phase locked loops and, more particularly to, a phase detector with frequency steering for phase locked loops.

BACKGROUND OF THE INVENTION

Generally, phase detectors for use in phase locked loops (PLL's) are known in the art. In a PLL, a phase detector compares the phase of the reference signal to the phase of a divided voltage controlled oscillator (VCO) signal. The output of the phase detector then drives a charge pump which in turn drives a loop filter followed by a VCO. The VCO produces the VCO signal which is divided by a loop divider to generate the divided VCO signal.

Three common types of phase detectors known in the art include an exclusive-OR phase detector, a tri-state phase detector and a dual state phase detector. FIGS. 6–8 describe an exclusive-OR phase detector in accordance with the prior art. FIGS. 9–13 describe a tri-state phase detector in accordance with the prior art. FIGS. 14–21 describe a dual state phase detector in accordance with the prior art.

Turning first to the exclusive-OR phase detector, FIG. 6 illustrates a block diagram of an exclusive-OR phase detector 600 in accordance with the prior art. FIG. 7 illustrates a timing diagram 700 for the exclusive-OR phase detector 600 of FIG. 6 in accordance with the prior art. FIG. 8 illustrates a graph 800 depicting output voltage versus phase for the exclusive-OR phase detector 600 of FIG. 6 in accordance with the prior art.

In FIG. 6, the exclusive-OR phase detector 600 has two input terminals and an output terminal. A first terminal receives a divided reference frequency signal 604 from a reference frequency divider (not shown). A second terminal receives a divided VCO frequency signal 606 from a loop divider (not shown). The output terminal produces a phase error signal 608. Typically, the phase error signal is a voltage signal.

The exclusive-OR phase detector 600 operates according to a timing diagram 700 of the waveforms represented in FIG. 7 and according to the following truth table.

| Source 1 (604) | Source 2 (606) | Output (608) |
| --- | --- | --- |
| 0 | 0 | 0 |
| 0 | 1 | 1 |
| 1 | 0 | 1 |
| 1 | 1 | 0 |

When the two sources produce signals 604 and 606 that are in phase, the output voltage 608 is at a logic zero level. When the two sources produce signals 604 and 606 that are 180 degrees out of phase, then the output voltage 608 is at a logic high level (typically, a logic supply voltage represented by Vcc). Any condition of phase shift between the logic zero level and the logic high level results in the output voltage 608 being averaged between the logic zero level and the logic high level. The output voltage 608 of the exclusive-OR phase detector 600 is filtered by a filter (not shown) to reduce the large variation between the logic zero level and the logic high level.

A graph 800 of the average output voltage 608 versus phase error for the exclusive-OR phase detector 600 is shown in FIG. 8. In FIG. 8, a gain of the exclusive-OR phase detector 600 is represented as the slope of the average output voltage 608 (Vcc) versus phase. In FIG. 8, the slope is Vcc/phase volts per radian.

The exclusive-OR phase detector 600 has at least two disadvantages. First, the same output voltage is generated for positive and negative phase errors. Thus, to lock the PLL at zero phase error the exclusive-OR phase detector 600 needs to be modified. Second, output voltage 608 of the exclusive-OR phase detector 600 depends on the pulse width of the input pulses from the two input signals 604 and 606. Thus, if one signal has narrow pulses and the other signal has wide pulses then the gain of the exclusive-OR phase detector 600 will be dramatically different.

Turning next to the tri-state phase detector, FIG. 9 illustrates a block diagram of a tri-state phase detector 901 and a charge pump 903 in accordance with the prior art. The tri-state phase detector 901 is generally an improvement over the exclusive-OR phase detector 600.

In FIG. 9, the tri-state phase detector 901 generally includes a first D-type flip flop 902, a second D-type flip flop 904, and an AND gate 906. The first D-type flip flop 902 has a first terminal, a second terminal, a third terminal, a fourth terminal and a fifth terminal. The first terminal is coupled to a positive supply voltage 908. The second terminal is coupled to receive a divided reference frequency signal 910 (Fref). The third terminal generates a first output signal 912. The fourth terminal generates a second output signal 914 (i.e., the UP (up) signal). The fifth terminal is coupled to receive a reset signal 924. The second D-type flip flop 904 has a first terminal, a second terminal, a third terminal, a fourth terminal and a fifth terminal. The first terminal is coupled to the positive supply voltage 916. The second terminal is coupled to receive a divided VCO frequency signal 918 (Fvco). The third terminal generates a first output signal 920. The fourth terminal generates a second output signal 922 (i.e., the DN (down) signal). The fifth terminal is coupled to receive the reset signal 924.

In FIG. 9, the charge pump 903 generally includes a first current source 926 and a second current source 928. The first current source 926 has a first terminal, a second terminal and a third terminal. The first terminal is coupled to the positive supply voltage 932. The second terminal is coupled to receive the UP signal 914 from the first D-type flip flop 902. The third terminal generates an output current signal 930. The second current source 928 has a first terminal, a second terminal and a third terminal. The first terminal 932 is coupled to the third terminal of the first current source 926 and is operative to produce the output current signal 930. The second terminal is coupled to receive the DN signal 922 from the second D-type flip flop 904. The third terminal is coupled to a ground potential.

Generally, in operation of the tri-state phase detector 901, a phase difference between Fref 910 and Fvco cause the UP signal 914 and the DN signal 922 of the tri-state phase detector 901 to vary. The UP signal 914 and the DN signal 922 of the tri-state phase detector 901 drive the two current sources 926 and 928 of the charge pump 903 which charge or discharge loop filter capacitors (not shown in FIG. 9) to form a voltage control for a VCO (not shown in FIG. 9) in a PLL (not shown in FIG. 9).

Particularly, in operation of the tri-state phase detector 901, consider the case where Fref 910 rises before Fvco 918, wherein both of the D-type flip flops 902 and 904 are edge triggered. On the rising edge of Fref 910, the first D-type flip flop 902 sets its first output signal 912 to a logic high and its second output signal 914 to a logic low. Both output signals 912 and 914 will remain in this state until Fvco 918 rises. When Fvco 918 rises then the second D-type flip flop 904 sets its first output signal 920 a logic high and its second output signal 922 to a logic low. The logic high of the first output signal 912 from the first D-type flip flop 902 and the logic high of the first output signal 920 from the second D-type flip flop 904 cause the AND gate 906 to generate the reset signal 924 at a logic high to reset both flip flops 902 and 904. When this reset occurs the tri-state phase detector 901 returns to its initial state and is ready to receive another set of pulses from Fref 910 and Fvco 918. This operation of the tri-state phase detector 901 causes the UP signal 914 will be low for a time which is equal to the delay between Fref 910 and Fvco 918. The logic low pulse from the UP signal 914 drives the first current source 926 which charges the loop filter capacitors in the PLL to a higher voltage. Responsive to the higher voltage, the VCO in the PLL increases its frequency to cause a pulse of Fvco 918 to occur sooner at a next sampling instance which in turn reduces the pulse width produced at the UP signal 914. This operation will continue until Fvco 918 occurs at the same time as Fref 910 resulting in essentially no pulse being produced at the UP signal 914. Alternatively, if the Fvco 918 had risen before Fref 910 then the DN signal 922 would have acted in an analogous manner, as described with the UP signal 914, to reduce a pulse of Fvco 918.

FIG. 10 illustrates a timing diagram 1000 for the tri-state phase detector 901 of FIG. 9 in accordance with the prior art. The timing diagram 1000 shows typical outputs for various exemplary phase differences. If Fref 910 leads Fvco 918 by an amount approaching 360 degrees, then the UP signal pulse 914 will be active for almost all time. This results in a positive current signal 930 being generated for the loop filter in the PLL. If Fvco 918 leads by an amount approaching 360 degrees, then the DN signal pulse 922 will be active for almost all time. This results in a negative current signal 930 being generated for the loop filter in the PLL.

FIG. 11 illustrates a graph 1100 of an output current versus phase offset for the tri-state phase detector 901 and the charge pump 903 of FIG. 9 when an up current source 926 and a down current source 928 are balanced in accordance with the prior art. In this graph 1100 the phase detector gain is Io/2p amps/radian. In comparison to the exclusive-OR phase detector 600, the problem of locking at zero phase offset has been solved. This can be seen in that the characteristic is an odd function about the graph's origin (i.e., the sign of the phase error is taken into account). For offsets beyond +/−2p, the gain will vary depending on the exact frequency relationship, but the net output current will always be such that the PLL will pull in the signal. This is known as frequency acquisition. By modifying the tri-state phase detector 901, it is possible to cause the net output current to hold at the desired up or down state (thus, resulting in the fastest possible tuning), if two or more pulses of one input 910 or 918 occur for each pulse of the other input 910 or 918.

Note that in the timing diagram 1000 showing representative pulses, the UP signal 914 and the DN signal 922 have pulses with minimum widths at the end of the control pulse, no matter what the net pulse is to be, due to the finite delay associated with the AND gate 906 and the flip flop reset. This minimum pulse is unavoidable in any real circuit and causes reference spurs. The reference spurs are caused by the minimum width pulse trains modulating the VCO in the PLL at the reference frequency which generate the spurs at harmonic frequencies of the reference frequency. In an ideal tri-state phase detector 901 with no minimum pulse width the correction term would tend to zero and thus eliminating any reference spurs. Ideally, even with the minimum pulses there would be no reference spurs, since both sources turn on to provide signals 910 and 918 which cancel each other. However, in reality the pulses are not perfectly time and amplitude balanced and thus spurs are produced. To overcome this problem, a delay is typically added at the output of the AND gate 906 to establish a minimum pulse width which is typically 4 to 10 nsec. This is done because in reality current sources do not turn on instantaneously.

FIG. 12 illustrates a timing diagram 1200 for the tri-state phase detector 901 and the charge pump 903 of FIG. 9 in accordance with the prior art. The timing diagram 1200 shows the operation of the pair of current sources 1026 and 1028 resulting in a net up pulse with and without minimum pulse width. If the minimum pulse width is not enough to insure that the current sources turn on, then there will be a range of small phase offsets for which the PLL will not respond. This is known as a dead zone. If a dead zone occurs, then once the PLL is within the dead zone the VCO is free running. Due to leakage currents the control voltage to the VCO will drop until the PLL moves out of the dead zone, at which time the PLL will correct the voltage to the other side of the zone and the process will repeat. The net result is a "sawtooth like" modulation of the VCO at a very low rate. Therefore, even though the tri-state phase detector 901 has improved in noise performance over the exclusive-OR phase detector 600, the need for filtering of reference spurs is still required due to the minimum pulse output and leakage currents on the loop filter.

The tri-state phase detector 901 also suffers from another non-ideally which limits its usefulness in applications which require high linearity. If the UP current signal 914 and the DN current signal 922 are not precisely balanced then the gain of the tri-state phase detector 901 will differ depending on the sign of the phase error. FIG. 13 shows an example of this situation. FIG. 13 illustrates a graph 1300 of an output current versus phase offset for the tri-state phase detector 901 and the charge pump 903 of FIG. 9 when the up current source 926 and the down current source 928 are not balanced in accordance with the prior art. In FIG. 13, the slope of plot 1302 is different than that of plot 1304. Although this not an issue for a standard synthesizer, in a fractional N synthesizer this imbalance will introduce non-linearities which will result in spurious outputs.

Turning next to the dual state phase detector, FIG. 14 illustrates a block diagram of a dual state phase detector 1401 and a charge pump 1403 in accordance with the prior art. To overcome the linearity issue associated with the tri-state phase detector 901, frequency synthesizers may employ a dual state phase detector 1401, as shown in FIG. 14.

In FIG. 14, the dual state phase detector 1401 generally includes a first D-type flip flop 1402 and a second D-type flip flop 1404. The first D-type flip flop 1402 has a first terminal, a second terminal, a third terminal, a fourth terminal and a fifth terminal. The first terminal is coupled to a positive supply voltage 1406. The second terminal is coupled to receive a divided reference frequency signal 1422 (Fref). The third terminal generates a first output signal 1410. The fourth terminal is not used. The fifth terminal is coupled to receive a reset signal 1412. The second D-type flip flop 1404 has a first terminal, a second terminal, a third terminal, a fourth terminal and a fifth terminal. The first terminal is coupled to the positive supply voltage 1408. The second terminal is coupled to receive a divided VCO frequency signal 1424 (Fvco). The third terminal generates a first output signal 1414 (i.e., the DN (down) signal). The fourth terminal is not used. The fifth terminal is coupled to receive the reset signal 1412.

In FIG. 14, the charge pump 1403 generally includes a first current source 1416 and a second current source 1418. The first current source 1416 has a first terminal and a second terminal. The first terminal is coupled to a positive supply voltage. The third terminal generates an output current signal 1420. The second current source 1418 has a first terminal, a second terminal and a third terminal. The first terminal is coupled to the second terminal of the first current source 1416 and is operative to produce the output current signal 1420. The second terminal is coupled to the third terminal of the second D-type flip flop 904 and is coupled to receive the DN signal 1414. The third terminal is coupled to a ground potential.

FIG. 15 illustrates a timing diagram 1500 for the dual state phase detector 1401 and the charge pump 1403 of FIG. 14 in a phased locked condition in accordance with the prior art. In the dual state phase detector 1401, the locked condition corresponds to a "square wave" of current of amplitude equal to I. This means that there are equal up and down current pulses and thus net zero charge transfer to the loop filter in the PLL. Note that in the dual state phase detector the condition of lock occurs when the input waveforms 1422 and 1424 are 180 degrees out of phase. If the phase of Fvco 1424 leads that of Fref 1422, then the duty cycle of the DN signal 1414 increases until the current is sinking I to ground continuously at 360 degrees. Alternatively, as the phase of Fvco 1424 approaches that of Fref 1422, the output current signal 1420 duty cycle will approach zero and the net result will be a continuous current sourced to the loop filter. By example, FIG. 16 illustrates a timing diagram for the dual state phase detector 1401 and the charge pump 1403 of FIG. 14 when Fvco 1424 leads Fref 1422 in accordance with the prior art.

FIG. 17 illustrates a graph 1700 of a net output current versus phase offset for the dual state phase detector 1403 of FIG. 14 when the up current source 1416 and the down current source 1418 are balanced 1702 and not balanced 1704 in accordance with the prior art. The dual state phase detector 1401 is nearly perfectly linear because the pulse width of the down current source 1418 is made to be twice the current, 2I, of the up current source 1416 while the up current source 1416 is made to be a constant current, I. Therefore, if an imbalance exists between the up 1416 and down 1418 current sources due to a decrease in the current provided by the up current source 1416, the balanced plot 1702 shifts along the y-axis to the unbalanced plot 1704 shown in dashed line, but the linearity of the unbalanced plot 1704 will not be affected.

FIG. 18 illustrates a timing diagram 1800 for the dual state phase detector 1401 and the charge pump 1403 of FIG. 14 when Fvco 1424 leads Fref 1422 and has a higher frequency than the Fref 1422 in accordance with the prior art. In FIG. 18, Fvco is at a second harmonic frequency of Fref. Note that the output current 1420 is almost equal to the locked condition of a square wave or zero net charge transfer out of the charge pump. If the phase error was zero, then this would be true. This situation occurs when Fref * A=Fvco* (A+1) where A is an integer. Most of the resulting waveforms of Iout will not be square waves in these cases. However the net charge transfer will be zero. Therefore, the classical dual state phase detector has points of net zero output charge transfer at frequencies were A*Fref=(A+1) * Fvco if the phase of the input waveforms are correct. This can cause the PLL to falsely lock at integer ratios (other than 1:1) of the two input waveforms. Some of these integer ratios may be very close to the desired frequency and thus this type of phase detector may malfunction even for synthesizers with narrow tuning ranges. FIG. 18 shows a slight phase offset of the harmonic waveform. This is to point out that if the phase relationship of the second harmonic Fvco was not precisely aligned with Fref, then the phase detector output would have the correct polarity to steer the frequency correctly. Therefore, in the ideal situation the false lock to integer ratios other than 1:1 are metastable states since any movement in phase from the precise alignment will cause the loop to move away from the point. This is shown in FIG. 19 for two different integer ratios of frequencies. In this case the two false lock frequencies have characteristics which do not "cross the zero axis" of net current.

FIG. 19 illustrates a graph 1900 depicting a net output current versus phase for the phase detector 1401 and the charge pump 1403 of FIG. 14 operating without frequency steering in accordance with the prior art. Graphs of this type, as disclosed herein, are for general explanation purposes only and are not meant to represent a precise plot. The reason is that the phase error between two different frequencies would not be clearly defined. The purpose of this graph 1900 is to show that there will be multiple lock points above and below the desired point and that these points touch but do not cross the x-axis.

If the up 1416 and down 1418 current sources are precisely balanced in a 1 to 2 ratio, respectively, then plot of Iout versus phase will be represented as shown in FIG. 19. However, if there is a slight imbalance in the currents of the up 1416 and down 1418 current sources, then a false lock will be possible. This false lock condition is shown in FIGS. 20 and 21. FIG. 20 illustrates a graph 2000 depicting a net output current versus phase for the phase detector 1401 and the charge pump 1403 of FIG. 14 operating with frequency steering produced by an increase in the up current source 1416 in accordance with the prior art. FIG. 21 illustrates a graph 2100 depicting a net output current versus phase for the phase detector 1401 and the charge pump 1403 of FIG. 14 operating with frequency steering produced by a decrease in the up current source 1416 in accordance with the prior art. In these cases an increase in the current provided by the up current source 1416 will cause false lock conditions on the positive x-axis and a decrease in the current provided by the up current source 1416 will cause false lock conditions on the negative x-axis. Either condition will cause incorrect phase detector operation.

Accordingly, there is a need for a phase detector for a phase locked loop that minimizes false locks between the phase of the divided reference frequency signal (Fref) 1422 and the phase of the divided voltage controlled oscillator frequency signal (Fvco) 1424.

BRIEF DESCRIPTION OF THE DRAWINGS

FIG. 11 illustrates a graph of an output current versus phase offset for the tri-state phase detector and the charge pump of FIG. 9 when an up current source and a down current source are balanced in accordance with the prior art.

FIG. 12 illustrates a timing diagram for the tri-state phase detector and the charge pump of FIG. 9 in accordance with the prior art.

FIG. 13 illustrates a graph of an output current versus phase offset for the tri-state phase detector and the charge pump of FIG. 9 when the up current source and the down current source are not balanced in accordance with the prior art.

FIG. 14 illustrates a block diagram of a dual state phase detector and a charge pump in accordance with the prior art.

DETAILED DESCRIPTION OF A PREFERRED EMBODIMENT

Figure 1:
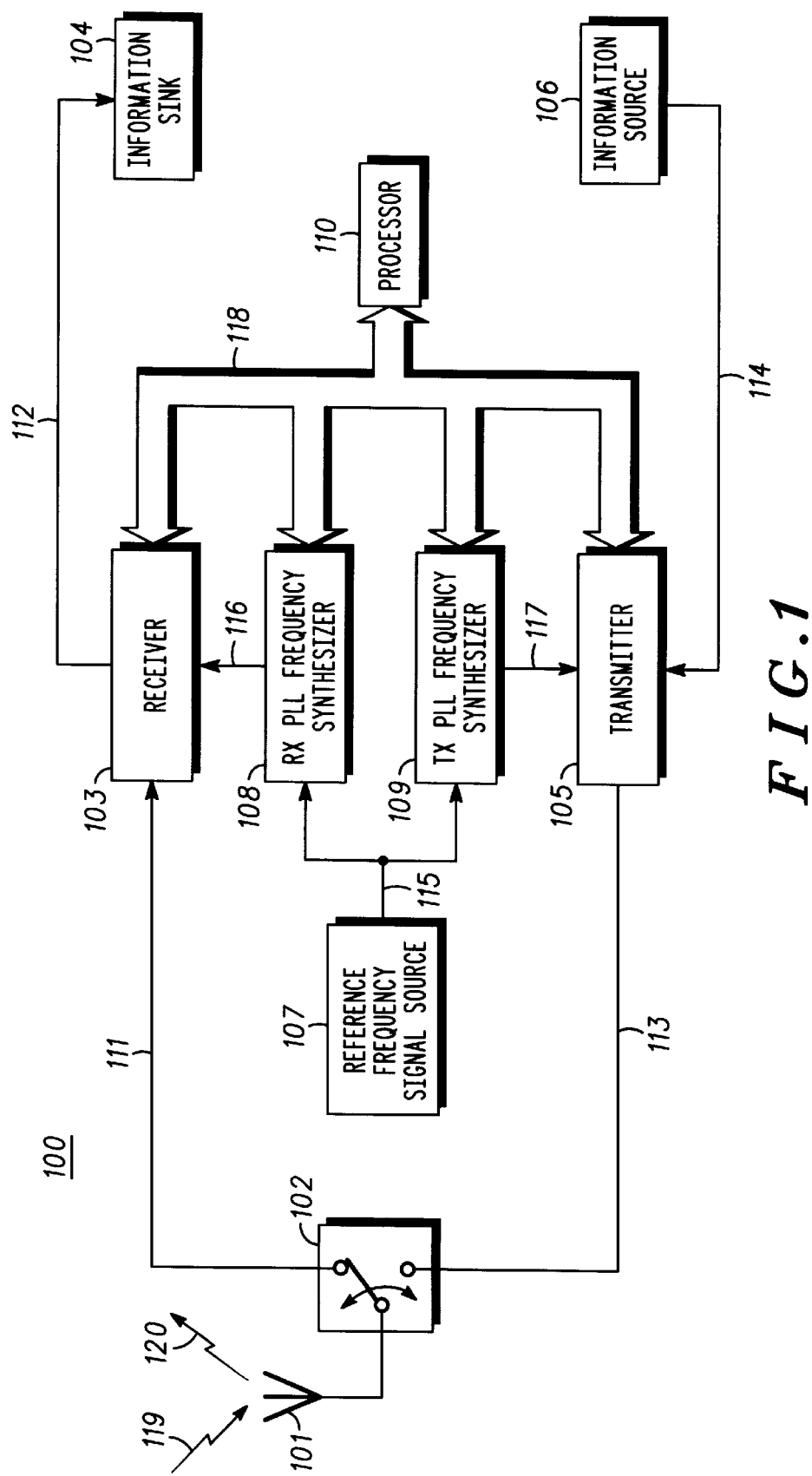
FIG. 1 illustrates a block diagram of a radio communication transceiver in accordance with the present invention.

FIG. 1 illustrates, by example, a block diagram of a radio communication transceiver 100 (hereinafter referred to as "transceiver") in accordance with the present invention. The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. In the preferred embodiment, a subscriber unit having the transceiver 100 is a cellular radiotelephone adapted for use in the Global System Mobile (GSM) standard.

The transceiver 100 of FIG. 1 generally includes an antenna 101, a transceiver switch 102, a receiver 103, a transmitter 105, a reference frequency signal source 107, a receive (Rx) phase locked loop (PLL)frequency synthesizer 108, a transmit (Tx) PLL frequency synthesizer 109, a processor 11 0, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The transceiver switch 102 provides time division multiplexed (TDM) selectivity to switch between the RF received signal at line 111 and the RF transmit signal at line 113 responsive to the transceiver 100 receiving a signal during a desired receive time slot in the GSM standard and transmitting a signal during a desired transmit time slot in the GSM standard, respectively. The receiver 103 is coupled to receive the RF received signal at line 111 and operative to produce a received baseband signal at line 112 for the information sink 104. The RF signal source 107 provides a reference frequency signal at line 115. The Rx PLL frequency synthesizer 108 is coupled to receive the RF signal at line 115 and information on a data bus 118 and operative to produce a receiver tune signal at line 116 to tune the receiver 103 to a particular RF channel. Likewise, the Tx PLL frequency synthesizer 109 is coupled to receive the RF signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 1 18. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system.

Figure 2:
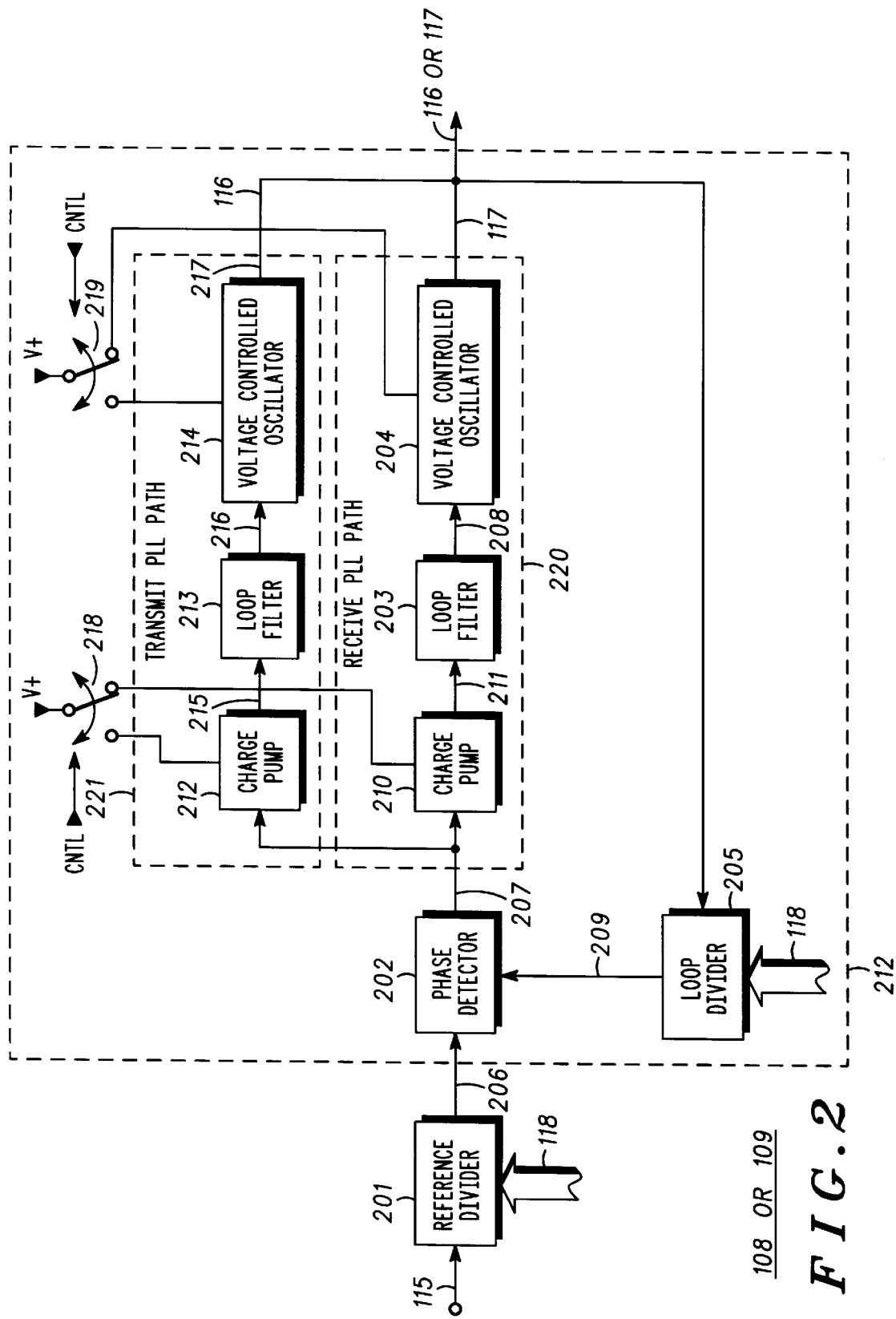
FIG. 2 illustrates a block diagram of a phase locked loop frequency synthesizer for use in the radio communication transceiver of FIG. 1 in accordance with the present invention.

FIG. 2 illustrates, by example, a block diagram of a phase locked loop (PLL) frequency synthesizer for use in the transceiver 100 of FIG. 1 in accordance with the present invention. The general structure of the PLL frequency synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201 and a PLL 225.

The PLL 225 generally includes a phase detector 202, a transmit PLL path 221, a receive PLL path 220, a loop divider 205, a charge pump control switch 218 and a voltage controlled oscillator (VCO) control switch 219. The transmit PLL path 221 includes a charge pump 212, a loop filter 213 and a VCO 214. The receive PLL path 220 includes a charge pump 210, a loop filter 220 and a VCO 204.

The interconnection of the blocks of the PLL frequency synthesizer 108 or 109 is described as follows. The reference divider 201 is coupled to receive a reference frequency signal on line 115 and is coupled to the data bus 118, and is operative to produce a divided reference frequency signal at line 206. The phase detector 202 is coupled to receive the divided reference frequency signal at line 206 and a feedback signal at line 209, and is operative to produce a phase error signal at line 207.

In transmit PLL path 221, the charge pump 212 is coupled to receive the phase error signal at line 207, and is operative to produce a charge pump signal at line 215. The loop filter 213 is coupled to receive the charge pump signal at line 215, and is operative to produce a filtered signal at line 216. The VCO 214 is coupled to receive the filtered signal at line 216 and is operative to produce an output frequency signal at line 116.

In receive PLL path 220, the charge pump 210 is coupled to receive the phase error signal at line 207, and is operative to produce a charge pump signal at line 211. The loop filter 203 is coupled to receive the charge pump signal at line 211, and is operative to produce a filtered signal at line 208. The VCO 204 is coupled to receive the filtered signal at line 208 and is operative to produce an output frequency signal at line 117.

The charge pump control switch 218 is coupled to the charge pump 210 in the receive PLL path 220 and the charge pump 212 in the transmit PLL path 221, and is operative to selectively enable one of the charge pump 210 and the charge pump 212. The VCO control switch 219 is coupled to the VCO 204 in the receive PLL path 220 and the VCO 214 in the transmit PLL path 221, and is operative to selectively enable one of the VCO 204 and the VCO 214. The charge pump 210 and the VCO 204 are enabled at the same time when the transceiver switch 102 couples the antenna 101 to the receiver 103. The charge pump 212 and the VCO 214 are enabled at the same time when the transceiver switch 102 couples the antenna 101 to the transmitter 105. The charge pump control switch 218 and the VCO control switch 219 are preferably controlled by different control signals, but may alternatively be controlled by the same control signal. Further, the charge pump control switch 218 and the VCO control switch 219 preferably provide control by selectively providing power to and removing power from the respective PLL elements.

The loop divider 205 is coupled to receive the output frequency signal at line 116 or 117, and is operative to produce the feedback signal at line 209. The loop divider 205 and the reference divider 201 receive programming information via the data bus 118.

The operation of the PLL frequency synthesizer 108 or 109 is described as follows. The PLL 225 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the PLL 225 typically provides a constant phase difference between the divided reference frequency signal at line 206 and the divided output frequency signal at line 209. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL will attempt to adjust the frequency of the output frequency signal at line 116 or 117 to drive the phase error at line 207 toward zero.

The PLL frequency synthesizer 108 or 109 is classified as belonging to one of at least two categories based on the predetermined frequency relationship of the output signal frequency at line 116 or 117 to the frequency of the reference frequency signal at line 115. The first category is classified as an "integer division" PLL frequency synthesizer wherein the relationship between the output frequency signal at line 116 or 117 and reference frequency signal at line 115 is an integer. The second category is classified as a "fractional division" PLL frequency synthesizer in which the relationship between the output frequency signal at line 116 or 117 and reference frequency signal at line 115 is a rational, non-integer number, consisting of an integer and a fraction.

Figure 3:
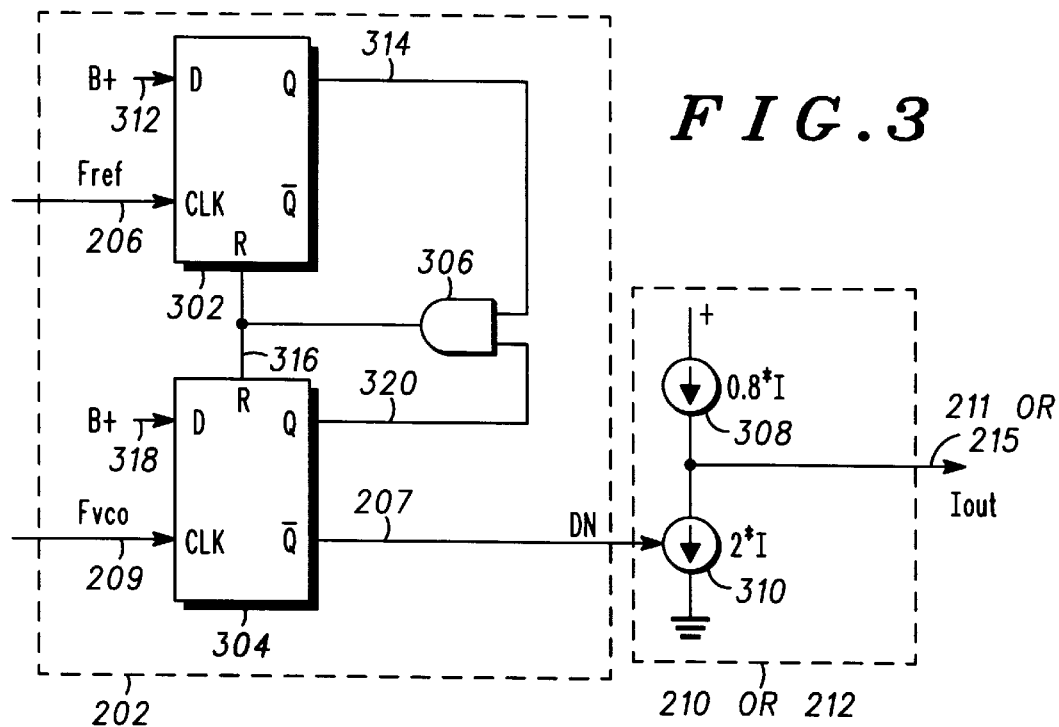
FIG. 3 illustrates a block diagram of a phase detector and a charge pump in accordance with the present invention.

FIG. 3 illustrates a block diagram of a phase detector 202 and a charge pump 210 or 212 in accordance with the present invention. The reference numbers for the phase detector 202 and a charge pump 210 or 212 in FIG. 3 correspond to the same reference numbers in FIG. 2.

Figure 9:
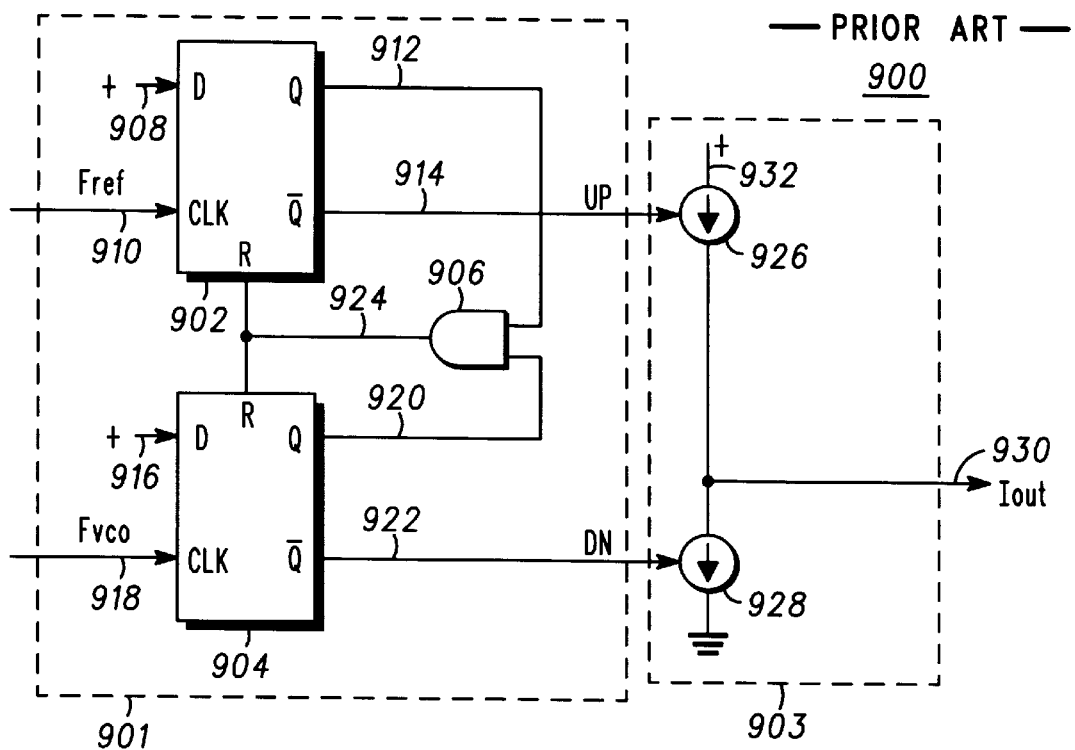
FIG. 9 illustrates a block diagram of a tri-state phase detector and a charge pump in accordance with the prior art.
Figure 10:
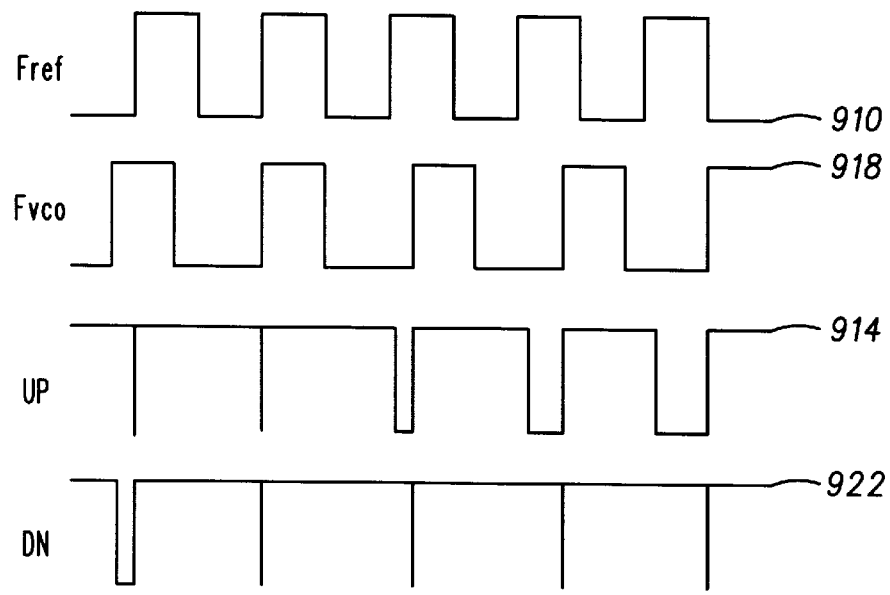
FIG. 10 illustrates a timing diagram for the tri-state phase detector of FIG. 9 in accordance with the prior art.
Figure 15:
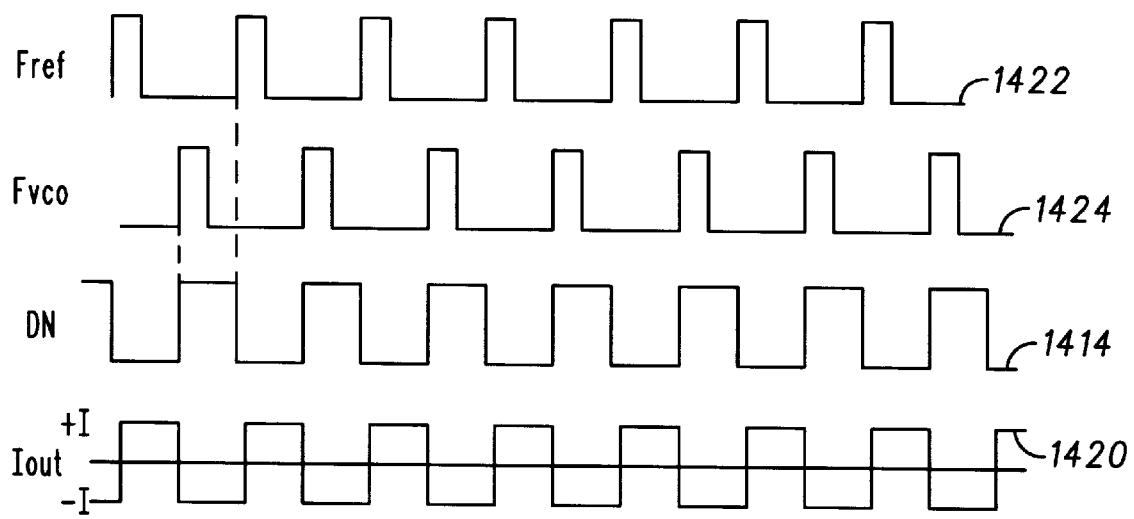
FIG. 15 illustrates a timing diagram for the dual state phase detector and the charge pump of FIG. 14 in a phased locked condition in accordance with the prior art.
Figure 16:
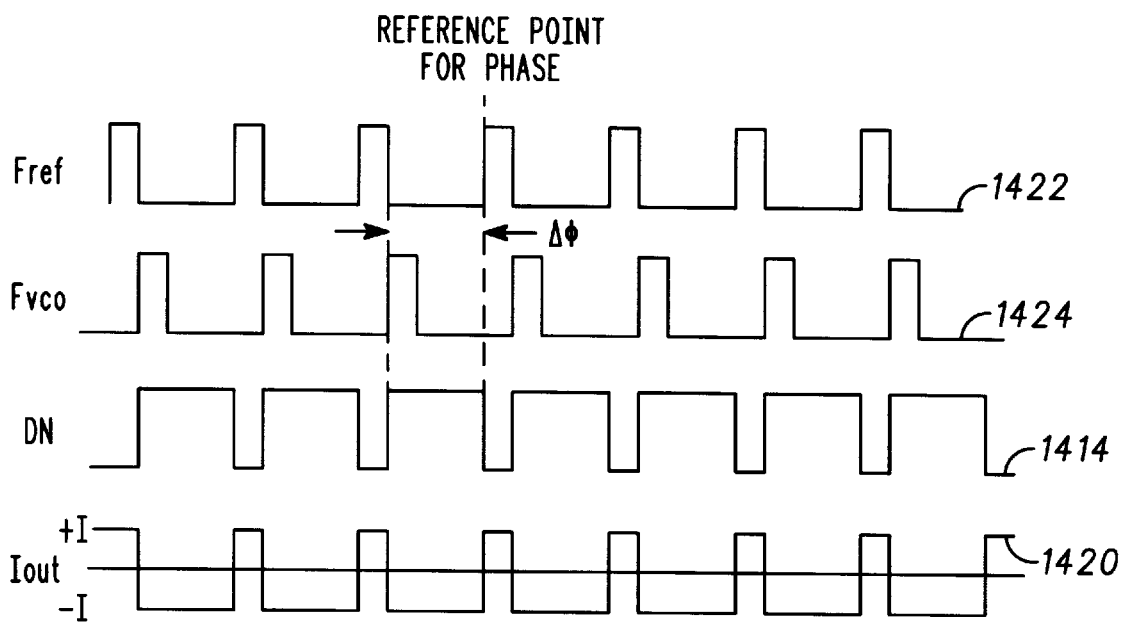
FIG. 16 illustrates a timing diagram for the dual state phase detector and the charge pump of FIG. 14 when the frequency of the voltage controlled oscillator leads the reference frequency in accordance with the prior art.
Figure 17:
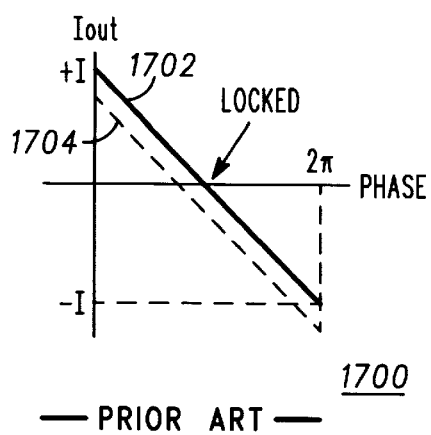
FIG. 17 illustrates a graph of a net output current versus phase offset for the dual state phase detector of FIG. 14 when an up current source and a down current source are balanced and not balanced in accordance with the prior art.
Figure 19:
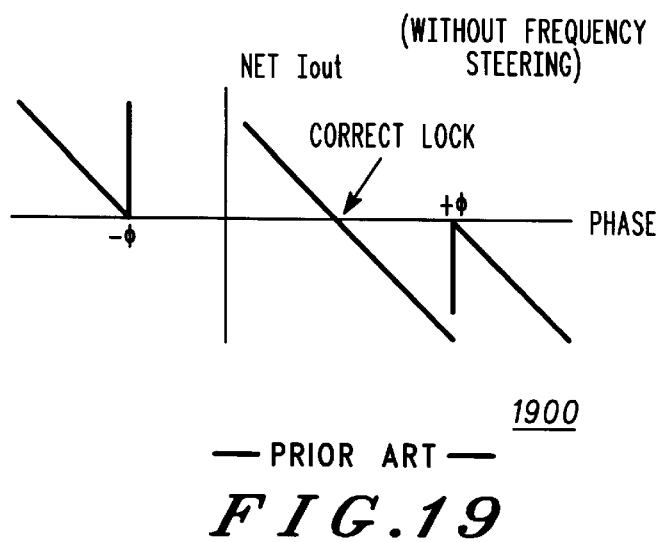
FIG. 19 illustrates a graph depicting a net output current versus phase for the phase detector and the charge pump of FIG. 14 operating without frequency steering in accordance with the prior art.
Figure 18:
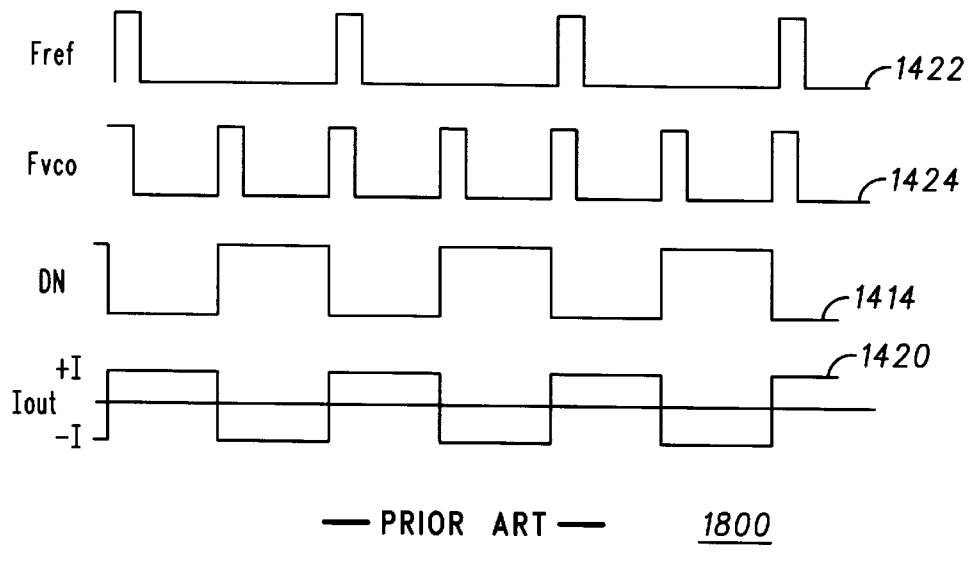
FIG. 18 illustrates a timing diagram for the dual state phase detector and the charge pump of FIG. 14 when the frequency of the voltage controlled oscillator leads the reference frequency and has a higher frequency than the reference frequency in accordance with the prior art.
Figure 20:
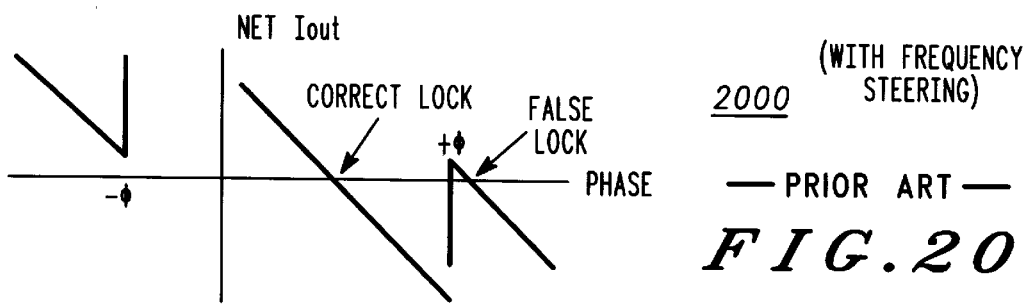
FIG. 20 illustrates a graph depicting a net output current versus phase for the phase detector and the charge pump of FIG. 14 operating with frequency steering produced by an increase in the up current source in accordance with the prior art.

The phase detector 202 of FIG. 3 has characteristics similar to and different from each of the tri-state phase detector 901 of FIG. 9 and the dual state phase detector 1401 of FIG. 14. The phase detector 202 of FIG. 3 is similar to the tri-state phase detector 901 of FIG. 9 in that it has two D-type flip flops and an AND gate and that an output signal of one D-type flip flop controls a down current source of a charge pump. However, the phase detector 202 of FIG. 3 is different from the tri-state phase detector 901 of FIG. 9 in that in FIG. 3 the up current source of the charge pump provides a constant current; whereas, in FIG. 9 the up current source of the charge pump is controlled by the an output signal of the other D-type flip flop in FIG. 9. The phase detector 202 of FIG. 3 is similar to the dual state phase detector 1401 of FIG. 14 in that it has two D-type flip flops and that an output signal of one D-type flip flop controls a down current source of a charge pump. However, the phase detector 202 of FIG. 3 is different from the dual state phase detector 1401 of FIG. 14 in that in FIG. 3 there is also an AND gate the up current source of the charge pump provides a constant current less than one half the current provided by the down current source; whereas, in FIG. 14 there is no AND gate and the up current source of the charge pump provides a constant current equal to one half the current provided by the down current source.

In FIG. 3, the phase detector 202 generally includes a first D-type flip flop 302, a second D-type flip flop 304, and an AND gate 306. The first D-type flip flop 302 has a first terminal, a second terminal, a third terminal, a fourth terminal and a fifth terminal. The first terminal is coupled to a positive supply voltage 312. The second terminal is coupled to receive a divided reference frequency signal 206 (Fref). The third terminal generates a first output signal 314. The fourth terminal is not used. The fifth terminal is coupled to receive a reset signal 316. The second D-type flip flop 304 has a first terminal, a second terminal, a third terminal, a fourth terminal and a fifth terminal. The first terminal is coupled to the positive supply voltage 318. The second terminal is coupled to receive a divided VCO frequency signal 209 (Fvco). The third terminal generates a first output signal 320. The fourth terminal generates a second output signal 207 (i.e., the DN (down) signal). The fifth terminal is coupled to receive the reset signal 316.

In FIG. 3 the charge pump 210 or 212 generally includes a first current source 308 and a second current source 310. The first current source 308 has a first terminal and a second terminal. The first terminal of the first current source 308 is coupled to the positive supply voltage. The second terminal of the first current source 308 generates an output current signal 211 or 215. The second current source 310 has a first terminal, a second terminal and a third terminal. The first terminal of the second current source 310 is coupled to the second terminal of the first current source 308 and is operative to produce the output current signal 211 or 215. The second terminal of the second current source 310 is coupled to receive the DN signal 207 from the second D-type flip flop 304. The third terminal of the second current source 310 is coupled to a ground potential.

Generally, in operation of the phase detector 202, a phase difference between Fref 206 and Fvco 209 causes the pulse width DN signal 207 of the phase detector 202 to vary. The DN signal 207 of the phase detector 202 drives the current source 310 of the charge pump 210 or 212 which charges or discharges capacitors of the loop filter 203 or 213 (shown in FIG. 2) to form a voltage control for the VCO 204 and 214 (shown in FIG. 2) in the PLL 225 (shown in FIG. 2). The charge pump 210 or 212 operates according to the following equation: Iout net=Iup−(Idown*duty cycle). In the preferred embodiment, Iout net=0 when Iup=0.8 I,Idown =2I and the duty cycle is 40%.

Particularly, in operation of the phase detector 202, consider the case where Fref 206 rises before Fvco 209, wherein both of the D-type flip flops 302 and 304 are edge triggered. On the rising edge of Fref 206, the first D-type flip flop 302 sets its first output signal 314 to a logic high. The first output signal 314 will remain in this state until Fvco 209 rises. When Fvco 209 rises then the second D-type flip flop 304 sets its first output signal 320 a logic high and its second output signal 207 to a logic low. The logic high of the first output signal 314 from the first D-type flip flop 302 and the logic high of the first output signal 320 from the second D-type flip flop 304 cause the AND gate 306 to generate the reset signal 316 at a logic high to reset both flip flops 302 and 304. When this reset occurs the phase detector 202 returns to its initial state and is ready to detect rising edges of pulses from Fref 206 and Fvco 209. When Fref 206 leads Fvco 209, the DN signal 207 is low for a time determined by the propagation of the two D-type flip flops 302 and 304 and the AND gate 306. The propagation logic includes the speed of the clock to Q going a logic high, then the Q output itself going to a logic high, then the reset signal 316 from the AND gate 306 going to a logic high, and then reset signal 316 going to a logic high causing Q to a logic low. Note that this time for propagation logic is not related to the phase difference between Fref 206 and Fvco 209. The logic low pulse from the DN signal 207 drives the second current source 310 which charges capacitors in the loop filter 203 or 213 in the PLL 225 to a lower voltage. This assumes that the VCO has a positive transfer of voltage to frequency. Alternatively, the VCO may have a negative transfer function, wherein the capacitors in the loop filter 203 or 213 in the PILL 225 would be charged to a higher voltage. Responsive to the lower voltage, the VCO 204 or 214 in the PLL 225 decreases its frequency to cause the rising edge of the pulse of Fvco 209 to occur later at a next sampling instance because its period has increased which in turn decreases the pulse width produced at the DN signal 207.

This operation will continue until Fvco 209 occurs at the same time as Fref 206 resulting in essentially an infinitely small pulse (due to the propagation delay described above) being produced at the DN signal 207.

Figure 4:
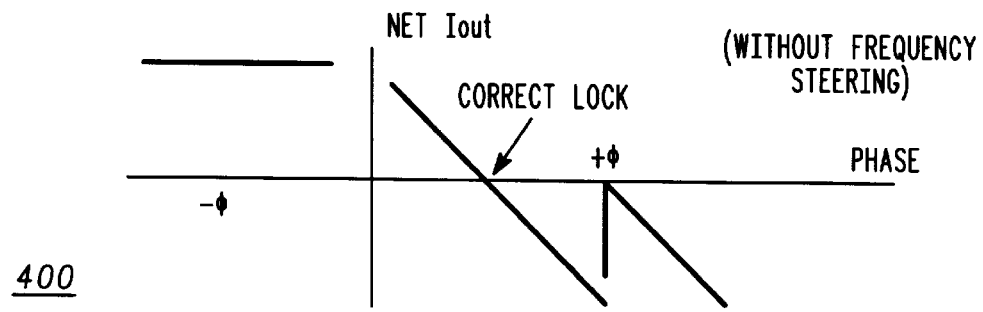
FIG. 4 illustrates a graph depicting a net output current versus phase for the phase detector and the charge pump of FIG. 3 operating without frequency steering in accordance with the present invention.
Figure 5:
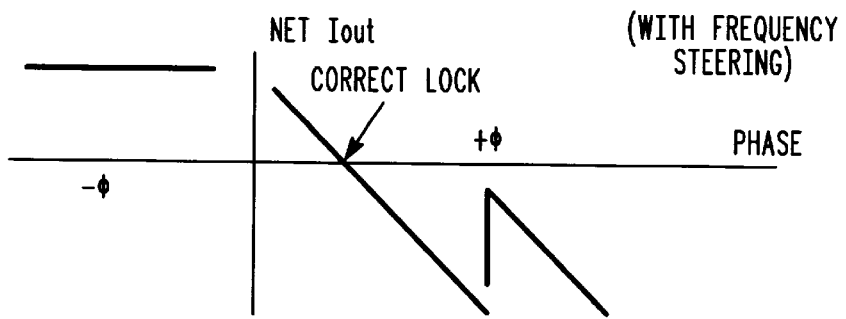
FIG. 5 illustrates a graph depicting a net output current versus phase for the phase detector and the charge pump of FIG. 3 operating with frequency steering in accordance with the present invention.
Figure 6:
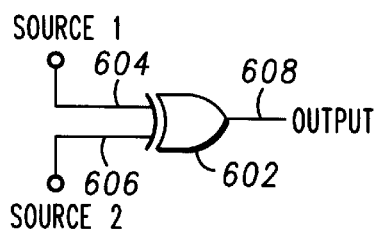
FIG. 6 illustrates a block diagram of an exclusive-OR phase detector in accordance with the prior art.
Figure 7:
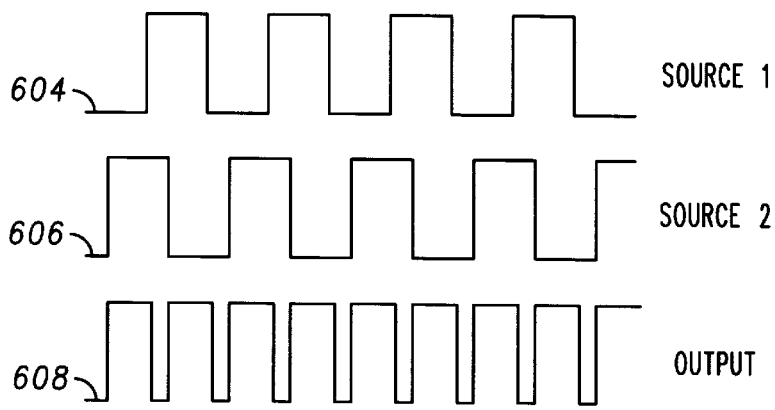
FIG. 7 illustrates a timing diagram for the exclusive-OR phase detector of FIG. 6 in accordance with the prior art.
Figure 8:
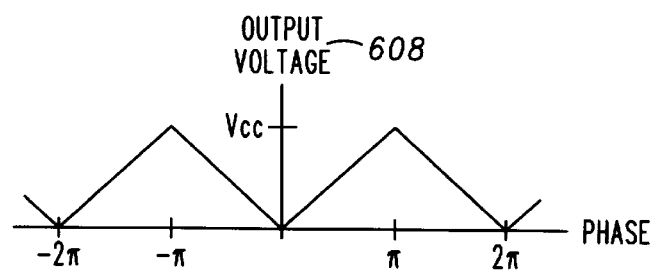
FIG. 8 illustrates a graph depicting output voltage versus phase for the exclusive-OR phase detector of FIG. 6 in accordance with the prior art.
Figure 21:
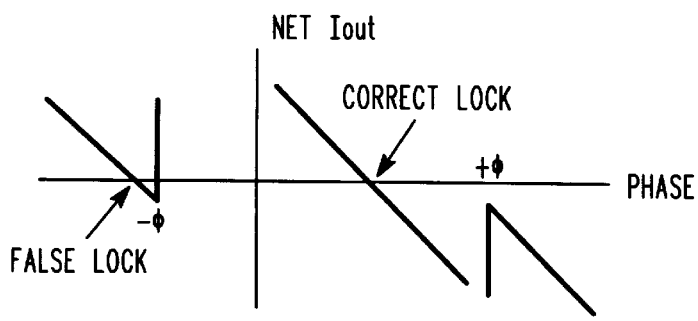
FIG. 21 illustrates a graph depicting a net output current versus phase for the phase detector and the charge pump of FIG. 14 operating with frequency steering produced by a decrease in the up current source in accordance with the prior art.

Alternatively, when Fref lags Fvco 209 then the pulse width of the DN signal is equal phase difference between Fref 206 and Fvco 209. If the phase difference is 40% of the crystal oscillator period which is the target value for a phase locked condition, then the net charge out of the charge pump is zero. If the phase difference is more than 40% of the crystal oscillator period, then the net charge out of the charge pump is negative, thus decreasing the voltage from the loop filter to decrease the VCO frequency which decreases the phase difference between Fref 206 and Fvco 209. If the phase difference is less than 40% of the crystal oscillator period, then the net charge out of the charge pump is positive, thus increasing the voltage from the loop filter to increase the VCO frequency which increases the phase difference between Fref 206 and Fvco 209. The 40% level of the crystal oscillator period must be less than 50% level of the crystal oscillator period to prevent false lock as shown in FIGS. 4 and 5 and is chosen based on the modulation of the synthesizer. In the preferred embodiment, the minimum duty cycle of 40% is determined by modulation window width (15.4 nsec) divided by period of the crystal oscillator (38 nsec.)=0.385 or 38.5% which is about 40%.

There is a limit on how small the up current source 308 can be. The dual state phase detector 1401 in FIG. 14 locks at π phase error with Iup=Idn/2. As Iup decreases the lock point approaches 0 degrees. However, zero is a discontinuity point for the dual state phase detector 1401 in FIG. 14 and is to be avoided, since the Idn pulse width would approach zero. In the preferred embodiment in FIG. 3, Iup=0.4 * Idn. This will result in a DN pulse width of 15.38 nsec with a 26 MHz reference. The 26 MHz is based on the GSM system. This corresponds to about 40% of the period. For a four accumulator fractional N synthesizer the divider will vary by +/−7 counts. Therefore the pulse width into the phase detector 202 will vary by a maximum of 7 times a period of the lowest VCO frequency. For a Global System Mobile (GSM) the lowest frequency is 880 MHz and thus the input pulse width can vary as much as +/−7.95 nsec. This results in the minimum DN pulse width being 7.43 nsec. This should allow sufficient margin for the Idn pulse to never hit a zero pulse width. Therefore, the phase detector 202 in FIG. 3 has the desired linearity of the conventional dual state phase detector 1401 in FIG. 14, but does not suffer from the potential locking problems at harmonic frequencies as does the conventional dual state phase detector 1401.

The frequency steering of the phase detector 202 can be implemented by different methods and circuits. The circuit in FIG. 3 is used because it added only one AND gate 306 to the conventional structure of the dual state phase detector 1401. In the preferred embodiment this is important, since the phase detector 202 is required to operate at high speed in ECL type of circuitry. If a more complex system were used for frequency steering, then it would have drawn significantly more current and required a large number of transistors.

FIG. 4 illustrates a graph depicting a net output current versus phase for the phase detector and the charge pump of FIG. 3 operating without frequency steering in accordance with the present invention. FIG. 5 illustrates a graph depicting a net output current versus phase for the phase detector and the charge pump of FIG. 3 operating with frequency steering in accordance with the present invention. When the up current source 308 is more than one half of the down current source 310 then a false lock could still occur as shown in FIG. 4. However, when the up current source 308 is intentionally made to be less than one half of the down current source 310, then there are no false locking states, as shown in FIG. 5.

In summary, the phase detector 202 has two D-type flip flops 302 and 304 and an AND gate 306 like a conventional tri-state phase detector 901 but is coupled to and drives the charge pump 210 or 212 like a conventional dual state phase detector 1401. In addition, the current provided by the up current source 308 is intentionally made to be less than half of the current provided by the down current source to avoid false locking points. The phase detector 202 is suitable for use in a digital complementary mosfet logic (DCML), high speed, low jitter phase detector consuming minimal current drain and minimal die area.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. A phase locked loop (PLL) comprising:
   a phase detector adapted to receive a representation of a reference frequency signal and a representation of a voltage controlled oscillator frequency signal and adapted to generate a phase error signal; and
   a charge pump including:
      a first current source having a first terminal and a second terminal, the first current source providing a first current; and
      a second current source having a first terminal and a second terminal, the second current source providing a second current,
      wherein one of the first current source and the second current source provides a constant current,
      wherein one of the first current source and the second current source, which does not provide the constant current, provides a variable current responsive to the phase error signal, and
      wherein the constant current is set to be less than one half of a minimum value of the variable current.

2. A PLL according to claim 1 wherein the phase detector further comprises:
   a first flip flop having a first terminal, a second terminal, a third terminal and a fourth terminal, the first terminal being coupled to receive a reference voltage, the second terminal being coupled to receive the representation of the reference frequency signal, the third terminal being coupled to receive a reset signal, the fourth terminal being operative to produce a first output signal;
   a second flip flop having a first terminal, a second terminal, a third terminal and a fourth terminal, the first terminal being coupled to receive the reference voltage, the second terminal being coupled to receive the representation of the voltage controlled oscillator frequency signal, the third terminal being coupled to receive the reset signal, the fourth terminal being operative to produce a second output signal; and
   a reset circuit having a first terminal, a second terminal and a third terminal, the first terminal being coupled to receive the first output signal from the first flip flop, the second terminal being coupled to receive the second output signal from the second flip flop, the third terminal being operative to produce the reset signal.

3. A PLL according to claim 1:
   wherein the first current source of the charge pump provides a constant up current, and
   wherein the second current source of the charge pump provides a variable down current.

4. A PLL according to claim 1:
   wherein the first current source of the charge pump provides a variable up current, and
   wherein the second current source of the charge pump provides a constant down current.

5. A phase locked loop (PLL) comprising:
   a phase detector adapted to receive a representation of a reference frequency signal and a representation of a voltage controlled oscillator frequency signal and adapted to generate a phase error signal, wherein the phase detector further comprises:
      a first flip flop having a first terminal, a second terminal, a third terminal and a fourth terminal, the first terminal being coupled to receive a reference voltage, the second terminal being coupled to receive the representation of the reference frequency signal, the third terminal being coupled to receive a reset signal, the fourth terminal being operative to produce a first output signal;
      a second flip flop having a first terminal, a second terminal, a third terminal and a fourth terminal, the first terminal being coupled to receive the reference voltage, the second terminal being coupled to receive the representation of the voltage controlled oscillator frequency signal, the third terminal being coupled to receive the reset signal, the fourth terminal being operative to produce a second output signal; and
      a reset circuit having a first terminal, a second terminal and a third terminal, the first terminal being coupled to receive the first output signal from the first flip flop, the second terminal being coupled to receive the second output signal from the second flip flop, the third terminal being operative to produce the reset signal; and
   a charge pump including:
      a first current source having a first terminal and a second terminal, the first current source providing a first current; and
      a second current source having a first terminal and a second terminal, the second current source providing a second current,
      wherein one of the first current source and the second current source provides a constant current,
      wherein one of the first current source and the second current source, which does not provide the constant current, provides a variable current responsive to the phase error signal, and
      wherein the constant current is set to be less than one half of a minimum value of the variable current.

6. A PLL according to claim 5:
   wherein the first current source of the charge pump provides a constant up current, and
   wherein the second current source of the charge pump provides a variable down current.

7. A PLL according to claim 5:
   wherein the first current source of the charge pump provides a variable up current, and
   wherein the second current source of the charge pump provides a constant down current.

* * * * *